United States Patent [19]

Kaplan et al.

[11] Patent Number: 4,727,326
[45] Date of Patent: Feb. 23, 1988

[54] METHOD AND DEVICE FOR FORMING IMAGES BY NUCLEAR MAGNETIC RESONANCE

[75] Inventors: Daniel Kaplan, Paris; Georges Roux, Limours, both of France

[73] Assignee: Thomson-CGR, Paris, France

[21] Appl. No.: 843,266

[22] Filed: Mar. 24, 1986

[30] Foreign Application Priority Data

Mar. 26, 1985 [FR] France ................... 85 04494

[51] Int. Cl.[4] ........................................... G01R 33/20
[52] U.S. Cl. .................................................... 324/309
[58] Field of Search ........................................ 324/309

[56] References Cited

U.S. PATENT DOCUMENTS 4,607,223  8/1986  Mallard et al. ............. 324/309
4,620,154 10/1986  Inouge ........................ 324/309

FOREIGN PATENT DOCUMENTS 0117042  8/1984  European Pat. Off. .
3125502  1/1983  Fed. Rep. of Germany .
2056088  3/1981  United Kingdom .
2113399  8/1983  United Kingdom .

OTHER PUBLICATIONS

Physics in Medicine and Biology, vol. 25, No. 4, 1980, pp. 748-751, Londres, GB; C. R. Ling, et al.; "Comparision of NMR Water Proton T1 Relaxation Times of Rabbit Tissues at 24 MHz and 2.5 MHz" p. 749, lines 1-7; p. 749, lines 30-34; p. 751, lines 7-10.

Journal of Nuclear Medicine, vol. 25, No. 3, Mar. 1984, pp. 371-382, the Society of Nuclear Medicine Inc., New York, U.S.; J. A. Koutcher, et al.,: "Principles of Imaging by Nuclear Magnetic Resonance" *pp. 375-378: Contrast and Pulse Sequences*.

IEEE Spectrum, vol. 20, No. 2, Feb. 1983, pp. 32-38, New York, U.S.; P. A. Bottomley: "Nuclear Magnetic Resonance; Beyond Physical Imaging" *pp. 33-36*.

Primary Examiner—Tom Noland
Attorney, Agent, or Firm—Oblon, Fisher, Spivak, McClelland & Maier

[57] ABSTRACT

The invention provides a method and device for forming images by nuclear magnetic resonance in which an image is constructed by discrimination of the intrinsic parameters of the tissues examined. The image is formed by putting forward the degrees of attachment and mobility of the nuclei of the tissues. The parameters displayed represent the field heterogeneities at the microscopic and molecular levels. The method consists in acquiring a first image using conventional methods then, after slightly varying the orientater magnetic field, in acquiring another image using the same methods. Then an image of another type is formed by representing the relative variations of the relaxation times between this first and this second image.

6 Claims, 4 Drawing Figures

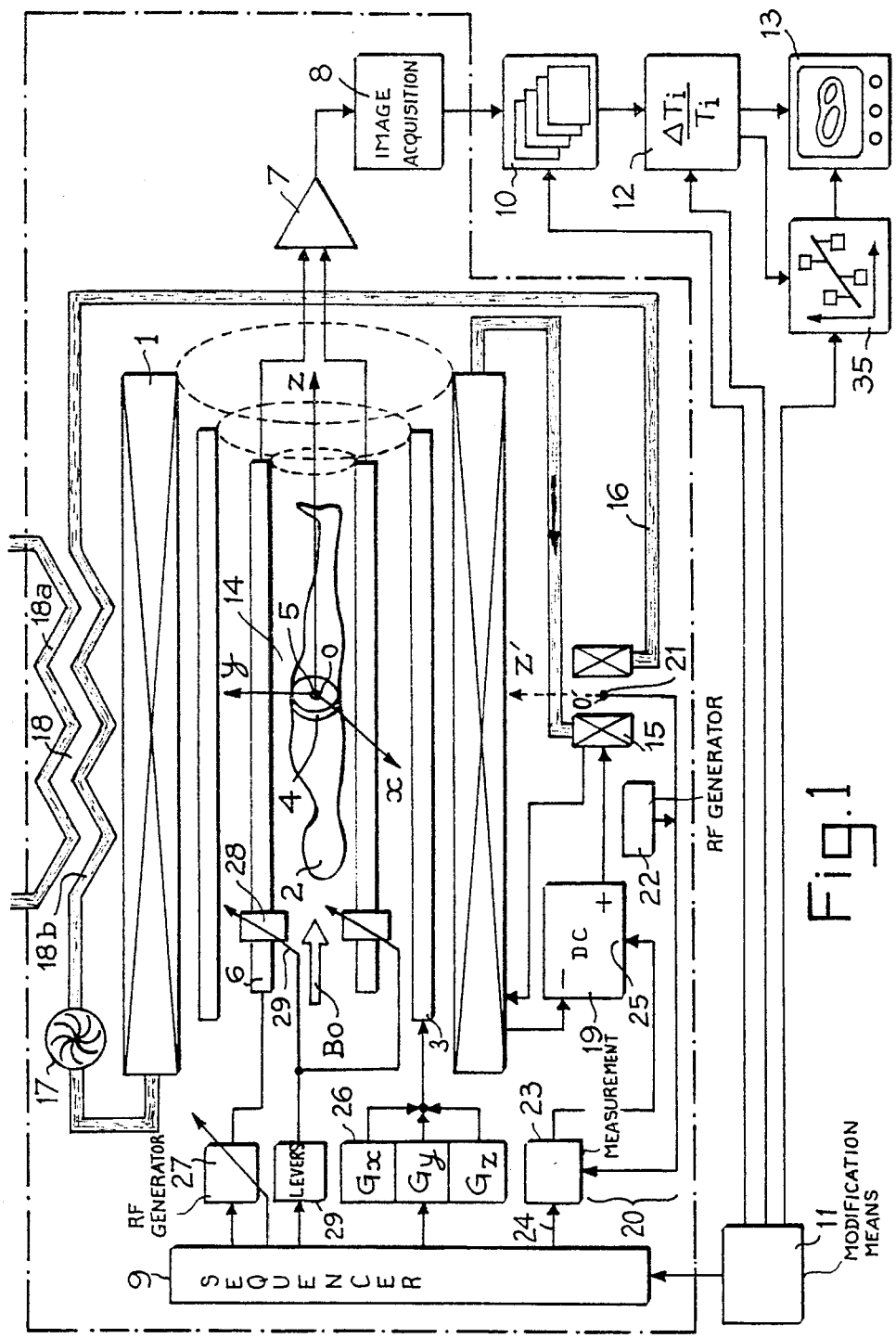

METHOD AND DEVICE FOR FORMING IMAGES BY NUCLEAR MAGNETIC RESONANCE

IBACKGROUND OF THE INVENTION

1. Field of the Invention

The present invention relates to a method and device for forming images by nuclear magnetic resonance of the type used in the medical field.

Image formation by nuclear magnetic resonance is becoming more and more widespread mainly as a medical diagnostic means. By this means internal tissue structures can be made visible to the eye with a contrast and resolution never attained simultaneously by the other image forming methods. In order to obtain an image by nuclear magnetic resonance (MRI) of an organ section with differentiation of the characteristics of the tissue of this organ, the property is used which is possessed by certain atomic nuclei such as protons of orienting their magnetic moments, associated with the spins of the nucleus, while acquiring energy when they are placed in a main magnetic field $B_0$. A particular zone of the object containing nuclei then has an overall magnetic moment which can be caused to swing in a given orientation, perpendicular to or coaxial with the field $B_0$, while inducing a resonance by emission of a radio frequency field perpendicular to the main field.

All the nuclei then having a magnetic moment rotating at a precession frequency, called Larmor's frequency, tend to return to the initial orientation due to $B_0$ while emitting a radio frequency signal at the characteristic resonance frequency of $B_0$ and of the nucleus. This signal may be picked up by a reception antenna. The time required by the overall magnetic moment of a region considered to return to balanced conditions depends on two important factors: the spin-mesh work interaction and the spin-spin interaction of the nuclei with the surrounding matter. These two factors lead to the definition of two relaxation times called $T_1$ and $T_2$. A region considered of an object emits then a signal whose intensity depends on $T_1$, $T_2$, on the protonic density in the region and on the time which has passed since the radio frequency excitation.

In order to locate a region of the organ it is necessary to identify the nature of its emission as a function of the local magnetic field conditions. These local conditions are imposed so that the emission frequency is characteristic of the location in space of the region of the organ. For that, pulsed magnetic field gradients are superimposed on the main field $B_0$. These gradients are oriented in directions X, Y, Z for defining at all times volume elements which emit signals at known precession frequencies. For acquiring an image, the local conditions are imposed by programmed sequences. These are stored in a pilot computer. These sequences also define the excitation times of the nuclei by the so called selective radio frequency pulses as well as the reading or acquisition times of the data of the image.

A description of different sequences generally used may be found in the article by W. A. Edelstein et al. Journal of Computer Assisted Tomography 7 (3) 391.401.1983. This article which reviews the respective performances, taking into consideration the signal to noise ratio of the image data acquired, of the different types of sequence, further determines that from this point of view the most favorable for discriminating the relaxation time $T_1$ is the so called overlapping-saturation sequence.

DESCRIPTION OF THE PRIOR ART

In tissue structures the images are differentiated by the relaxation times $T_1$ and $T_2$. The images having a maximum contrast are generally those which promote visualization of the different $T_1$s of these tissue structures. Consequently, the sequences for acquisition of an MRI signal are generally optimized so as to give the mean $T_1$ of an organ or a tissue considered the best signal to noise ratio. In this case, the protonic density variations and the incidence of the relaxation time $T_2$ are best overcome. This is also mentioned in the above article. Nevertheless, certain errors in evaluating $T_1$ remain and artifacts appear in the contrast of the image. In particular, the contrast as a function of $T_1$ throughout the whole of a section of a body examined is disturbed by the imperfection of the homogeneity of the radio frequency excitation field and by the form of the selective pulse. In so far as the inhomogeneity of the excitation field is concerned this is obvious: different parts of a section, excited in different ways, of course subsequently restore different signals. The form of the selective pulse is also important because the section examined has a certain thickness (this thickness is related to the energy of the signal received). The disturbance due to the form of the selective pulse is related to the propagation of the excitation pulse in the thickness of the section.

There further exist tissues for which the $T_1$ of the healthy parts is given and for which the $T_1$ of the injured parts is the same. The image of a section of this tissue does not then reveal these injuries which it is desired to show.

SUMMARY OF THE INVENTION

The invention consists then in obtaining an image, the local information of which is an intrinsic function of the tissue parameters presiding at the emission of the resonance signal. Under these conditions the image no longer depends solely on the relaxation times, in particular $T_1$; it is at the same time as independent as possible of the acquisition sequencing and of the homogeneity imperfection due to the excitation field and to the form of the selective pulse.

The invention provides a method of image formation by nuclear magnetic resonance in which an image of the volume element of a section of a body to be examined is acquired by discrimination of the relaxation times of the nuclei of these volume elements in the presence of a given orientater magnetic field $B_0$, characterized in that this acquisition is reiterated for another value of the field $B_0$ and in that an image of the section, of another type, is formed by representing for each image element the relative variations of the relaxation times between this first and this second acquisition.

The invention also provides a device for forming images by nuclear magnetic resonance of the type comprising:

means for subjecting the body to be examined to an orientater magnetic field $B_0$;

field gradient means for determining a section of the body, means for producing a pulsed alternating magnetic field for exciting the nuclei of the volume elements of the section, means for measuring the relaxation times of these nuclei after excitation,
and means for acquiring an image of the section by representation of these relaxation times,
which device further comprises:
means for keeping the image acquired stored in memory,
means for varying the field $B_0$ and the frequency of the pulsed alternating magnetic field so as to acquire, using the same procedure, another image of the same section,
and means for forming an image of the section, of another type, by representing the relative variations of the relaxation times between the first and second acquisition.

BRIEF SUMMARY OF THE DRAWINGS

The invention will be better understood from reading the following description with reference to the accompanying Figures. These Figures are given by way of indication and are in no wise limitative of the invention. They show:

FIG. 1, a device in accordance with the invention.

DESCRIPTION OF THE PREFERRED EMBODIMENT OF THE INVENTION

Figure 2A:
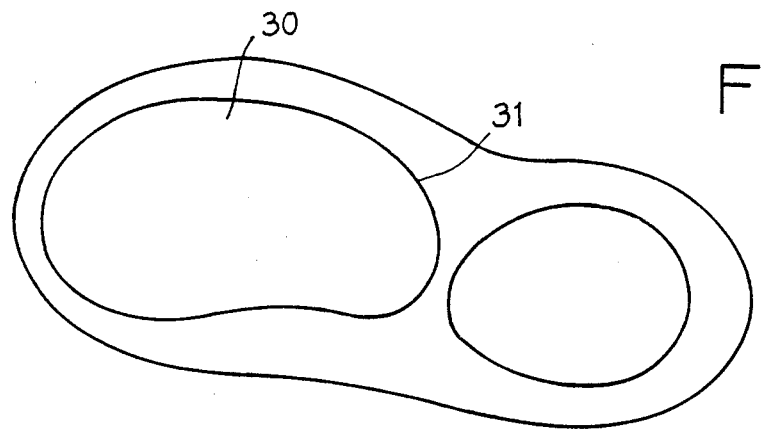
FIGS. 2a and 2b, a schematic representation of images obtained without and with the method of the invention.

The theory of magnetic resonance on the one hand, confirmed by numerous experiments on the other, has shown that $T_1$ and $T_2$ depend on the precession, or resonance frequency. This latter is moreover directly proportional to the main field $B_0$ in which the nuclei are plunged. It is possible to express the dependence of $T_1$ on $B_0$ in a relationship such as:

$$T_1 = f(\alpha, m, B_0)$$

where $\alpha$ and $m$ are parameters depending on the structures of the tissues. These parameters define the degree of attachment and mobility of the nuclei (protons) of the tissues. These parameters are representative of the field heterogeneities at the microscopic and molecular level. For example a function, well correlated with different experiments, is of the form:

$$T_1 = m.B_0^\alpha$$

In accordance with the invention it is deduced therefrom that for a variation of $\Delta B_0$ of $B_0$ a variation $\Delta T_1$ of $T_1$ is obtained of the form:
$\Delta T_1 = f'(B_0)\Delta B_0$ if $\Delta B_0$ is small with respect to $B_0$.
In the example given this formulation becomes:

$$T_1 = m\alpha B_0^{\alpha-1}. \Delta B_0.$$

The idea of the invention is then to acquire and to process images in different fields $B_0$ so that only the differences of $T_1$ are preponderant in the final image. In this case, an image is obtained whose main contrast depends on the tissue structure parameters $m$ and $\alpha$.

Let us consider an image element, or pixel i, which represents a volume element whose relaxation time is $T_{1,i}$. The amplitude of the signal I received, concerning this pixel i is of the form $$I_i = h(\rho_i) \times k(T_{1,i}) \times g(T_{2,i})$$

In this expression $\rho_i$ is the density of protons or nuclei in the region i and $T_{1,i}$ and $T_{2,i}$ are the values of the relaxation times $T_1$ and $T_2$, at $B_0$, in the same region. The functions h, k and g are of the type proportional to respectively $P_i$, $T_{1,i}$, and $T_{2,i}$. By the variation $\Delta B_0$ of the main magnetic field a new signal I is obtained different from the preceding one. The variation of the signal I is expressed in the form of an exact total differential:

$$\Delta I_i = h(\rho_i) \times k'(T_{1,i}). \Delta T_{1,i} \times g(T_{2,i}).$$

The portion relative to the drift of function g with respect to the variation of the field $B_0$ is neglected. This is justified because in the experiment excitation-measurement sequences were chosen adapted for measuring $T_1$ rather than $T_2$. Consequently, the measurements of I are by nature fairly independent of $T_2$. But in addition, since perfect independence of the measurement of $T_1$ with respect to $T_2$ is impossible, a second reason for eliminating the drift of g with respect to $B_0$ resides in the fact that the value of $T_2$ is very little affected by the variation of the orientational field: this is known experimentally. In the invention then it is the ratio $\Delta I_i/I_i$ which is considered which is equal to:

$$\Delta I_i/I_i = k'(T_{1,i}). \Delta T_{1,i}/k(T_{1,i}).$$

In this case it is considered that a new image in which the luminosity of the pixels is proportional to the relative variation of the intensity $I_i$ at each point, which variation is due to the variation of the main field, is essentially dependent on the relative variations of the $T_1$s and not on the $T_1$s themselves. The consequence of this situation is that the tissue structures may be differentiated in the new image even if in other respects they have the same relaxation time $T_1$. In fact, by replacing $\Delta T_1$ by its value calculated by the function f, in particular the one given in the above example we may write:

$$\Delta T_i/I_i = A(m_i, \alpha_i).m_i.\alpha_i. B_0^{\alpha_i-1}.\Delta B_0$$

where A represents the function $k'/k$. This expression is to be compared with the expression of $I_i$ which in short was representative of $T_1$. In the well correlated example $I_i$ was proportional to $m_i.B_0^{\alpha_i}$. Between the expression of $I_i$ and that of $\Delta I_i/I_i$ the exponent $\alpha_i$ now appears as a direct multiplier term. The combination of the parameters $m$ and $\alpha$ which is represented is therefore very different from the arangement of these parameters which was representative of $T_1$. This means that two adjacent volume elements i and j, which would give rise to the same relaxation times $T_1$ may be discriminated in the new image as separate patterns if their pairs of parameters $m_i$, $\alpha_i$ and $m_j$, $\alpha_j$ are different.

The new type of image thus formed is further free of the disturbances caused by the selective radio frequency pulses. We saw that the disturbances imposed on the relaxation times are caused by the inhomogeneities of the excitation fields. The result is that the general structure of the machines is adapted for resolving these problems "as well as possible". In the invention and provided that the disturbances applied are the same from one experiment to another when $B_0$ evolves, the fact of making a relative measurement normalizes the measurement. Thus at each point the measured inhomogeneities are eliminated since the measurements at each point are in this case no longer compared, as was the case for the conventional image, with respect to each other, from one adjacent point to another adjacent point, but rather at the same point, from one measurement at a given $B_0$ to a measurement at another given $B_0$. The expected advantage is thus obtained that the form of the selection pulse and the homogeneity of the excitation field become less critical.

FIG. 1 shows a device for implementing the image forming method of the invention. This device comprises means 1 for subjecting a body 2 to be examined to an orientater magnetic field $B_0$. It further comprises conventionally means 3 for producing field gradients along three axes x, y, and z so as to determine in the body a section 4 which comprises the volume elements 5 whose image it is desired to give. This device further comprises means 6 for producing a pulsed alternating magnetic field for exciting the nuclei of the volume elements. The measuring means 7, which produce measurements relative to the value of the relaxation times of the nuclei of the elements are connected to means 8 for acquiring an image of the section. This whole measuring chain comprises means known in themselves as well as in their association. In particular, all these means operate under the control of a programmed acquisition sequencer 9.

One of the features of the device of the invention is that it comprises means 10 for storing the acquired image and means 11 for varying the measurement conditions. In the invention, these measurement conditions relate to the field $B_0$ as well as to the frequency of the pulsed alternating magnetic excitation field. Once the measurement conditions have been modified another image is acquired. Another characteristic of the invention is that the device then comprises in addition means 12 for forming an image, of another type, of the section in question by representing the relative variations of the relaxation times between the first and second acquisition. These relative variations of the relaxation times are in fact estimated in the form of relative variations of the amplitudes of the measured signals. The justification for this was given above.

Accessorily, display means 13 are provided for displaying the image of another type thus formed.

Changing the measurement conditions is provided in the invention in a preferred way by using a device described in a previous French patent application filed by the applicant under the No. 84 19190. In this device a system of resistive magnets may be regulated for delivering a desired orientater magnetic field. This system is essentially formed of the large size resistive magnet 1. This magnet is designed for creating a relatively strong and very homogeneous magnetic field in a region 14 of its internal volume. This system further comprises a small size auxiliary magnet 15 and a circuit for the flow of a cooling fluid 16 in thermal contact with magnets 1 and 15. In an image forming application, magnet 1 is designed for generating a magnetic field between 0.15 and 0.5 teslas in a sphere of a diameter of 50 cm with center 0 (the center of symmetry of the magnet) and with a homogeneity of 1 to 10 ppm (parts per million).

Preferably the main element 1 comprises at least one Bitter coil. By "Bitter coil" is meant a coil formed from annular metal disks (made typically from copper or aluminium) defining turns of a solenoid. These disks are electrically insulated from each other (very often with interpositioning of insulating sheets of similar shape) but connected end to end for materializing said solenoid. Holes formed in the disks and in the insulators define channels which extend substantially parallel to the longitudinal axis of the solenoid and in which the cooling fluid flows.

In all cases, the magnet 1 has a structure providing an efficient heat exchange between the windings of the resistive coil or coils forming it and the cooling fluid. The same goes for magnet 15 which is arranged for receiving the same cooling fluid so as to be always substantially at the same temperature as the main magnet. It should be noted in this connection that the internal resistance of the auxiliary magnet is very small with respect to that of the main magnet so that its contribution to heating the fluid flowing in circuit 16 is in practice negligible. Furthermore, the coils of the two magnets 1 and 15 are made from the same conducting material more particularly copper or aluminium.

Circuit 16 further comprises a circulating pump 17 and an exchanger 18 whose secondary circuit 18b has the cooling fluid flowing therethrough and whose primary circuit 18a is fed with cold flowing water. In the example shown circuit 16 is designed so that the whole of the cooling fluid flows through the auxiliary magnet 15, but is is possible, using an appropriate by-pass, to cause only a part of this fluid to flow through magnet 15 since the temperature of this latter is always substantially equal to that of magnet 1, at all times. In this connection, it is particularly important for circuit 16 to be adapted so that the fluid flowing into magnet 15 comes directly from the main magnet 1 without passing through the exchanger 18.

In addition, the coils of magnets 1 and 15 at all times have the same current flowing therethrough delivered by a DC current source 19. The purpose of magnet 15 is to create a reference magnetic field representative of the field of the main magnet in at least a volume of its internal space where means are placed for measuring said reference field, for driving a chain 20 for pilot control of the current delivered by the DC current source 19. In a preferred embodiment, these means for measuring the reference field comprise, an NMR probe 21 for driving the pilot control chain 20, said probe being placed in said restricted volume. In order to obtain a usable NMR signal, the auxiliary magnet 15 is constructed so that the reference field is sufficiently homogeneous in the restricted volume where the probe is placed. In practice, the homogeneity of the reference field in the volume surrounding the probe must be from 1 to 10 ppm, that is to say of the same order of size as the homogeneity of the basic field in the useful volume in the main magnet.

Magnets 1 and 15 each have a longitudinal axis of symmetry, respectively Oz and O'z', 0 and 0' being the centers of symmetry of these magnets. According to an advantageous feature of the invention, the axis O'z' of the auxiliary magnet 15 is placed substantially in a transverse median plane (containing point O) of the main magnet 1 so as to intersect the axis Oz at point O. Magnet 15 remains of course outside magnet 1. This arrangement is the one which offers the lowest possible parasite coupling between the two magnets and which therefore least disturbs the homogeneity of the two fields. With the above described system, the current delivered by the DC current source 19 is permanently adjusted for regulating the value of the field in magnet 15. This field depends on the temperature of the magnet. By taking measures, as we saw above, for the temperature of magnet 15 to be the same as that of the main magnet, the following result is obtained in that the fields in both magnets are also proportional to each other. Consequently, regulation of the field in the auxiliary magnet involves regulation of the field in the main magnet.

The pilot control chain 20 is conventional and its components are available commercially, particularly for spectrometry applications. The NMR probe 21 in particular comprises a coupling coil surrounding a sample of chosen atoms. The pilot control chain comprises essentially a radio-frequency generator 22 feeding the coupling coil of the probe and emitting a signal at a frequency variable in time. A sweep of a certain frequency range including the NMR frequency is therefo-reapplied to the probe. In addition, the pilot control chain 20 also comprises means 23 for measuring the radio frequency signal at the terminals of said coupling coil. When the generator 22 is at the NMR frequency of the sample, an energy absorption phenomenon occurs and the radio frequency signal at the terminus of the coil is very greatly attenuated. The absorption signal is compared with a reference 24 for producing an error signal which is applied to a control input 25 of the power supply source 19. The variable frequency sweep is repeated regularly so as to constantly update the value of the error signal applied to the control input 25.

The device used in the invention is provided with a correction winding system (called "shims") known per se and not shown, essentially intended for offsetting the disturbing effects of the environment about the magnet; Magnet 1, whose purpose is to form the orientating field, is associated with a gradient coil system 3 known per se. The gradient coils are arranged on a cylindrical tubular mandrel placed inside the internal space 14 of the magnet 1 coaxially with axis Oz. The gradient coil system is completed by a DC current supply assembly 26 (Gx, Gy, Gz) controlled following a cycle of sequences preprogrammed in sequencer 19. Thus, different predetermined magnetic, strength and orientation field gradients are superimposed on the orientater field during said sequences. It is known that these gradients, among other things, allow a section 4 to be selected whose image it is desired to construct. A radio frequency antenna system 6 is also housed inside the useful space 14 of magnet 1. These antennae form part of the radio frequency emission-reception means which comprise a radio frequency generator 27 driven by the sequencer 9. This generator 27 produces calibrated radio frequency signal pulses during the sequences. NMR signals reemitted by the body during the examination are picked up by the same antenna system. They are used after reception in the receiver 7 connected to these antennae. In the invention, operation of sequencer 9 is modified when the measurement conditions are to be changed. In particular, a new reference magnitude is applied at 24 during the second image acquisition for modifying the value of the orientating field $B_0$ through action on the regulation chain 20. With the device described, this modification is rapidly stabilized, a new field value $B_0$ is established in a time of the order of or less than a minute. To take into account the variation of the orientater field antenna 6 is then tuned to a new resonance frequency by means of variable capacitors 28 connected in parallel across the antenna wires. These capacitors are actuated by complete amagnetic motor driven levers 29. An antenna of this type is described in the European patent application n° No. 82. 107332.7. Generator 27 is also tuned so that the frequency of the radio frequency pulses corresponds to the new measurement conditions.

The image processing means 12 essentially comprise means for calculating, pixel by pixel, the variations of intensity of the signals received between the two experiments and means for normalizing these variations with respect to one or other of these two intensities. These means 12, which for each pixel effect a subtraction followed by a division are preferably included in a programmed processor. This processor is if possible the same as the one which provides acquisition of the conventional image. In this case, the general program for processing the measurement data comprises a part assigned to the execution of the tasks described in the invention.

Figure 2B:
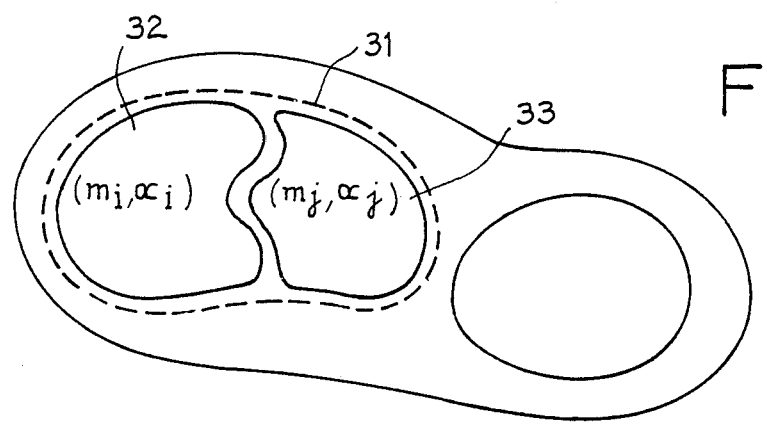

FIGS. 2a and 2b show schematically the topology of the images which may be acquired in accordance with a known method of the prior art (a) and in accordance with the method of the invention (b). In the image of the section shown, a tissue 30 is defined by its contour 31. The characteristic of this tissue which presided on establishment of this image is the uniformity, for all the regions of this tissue, of the relaxation time ($T_1$). In FIG. 2b, if the contour 31 may still be made out, it is essentially because it circumscribes two well defined regions 32 and 33 whose tissue parameters are different from one region to the other: the indices i on the one hand and j on the other. These regions are well differentiated for they correspond to different $\Delta I/I$. Finally, the overall image remains the same but an additional differentiation dimension has appeared. In some cases it may allow damaged parts of a tissue to be discriminated.

Figure 3:
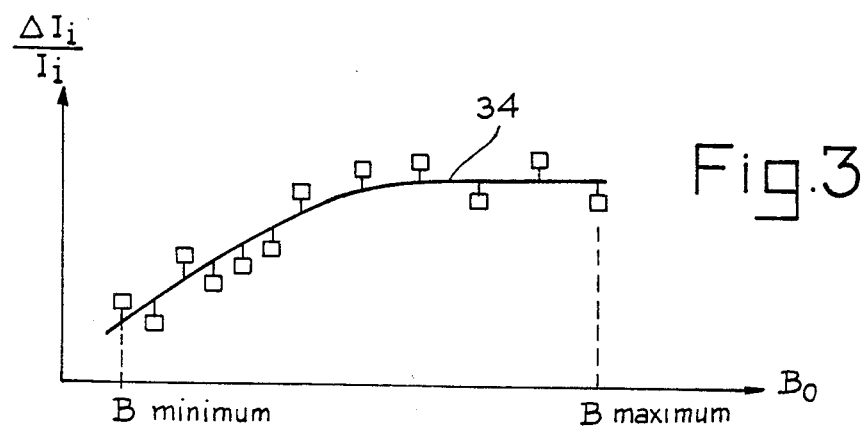
FIG. 3, a curve obtained in a variant of the method.

In a variant, rather than effecting only two experiments for two slightly different $B_0$s, $B_0$ can be varied between a minimum value and a maximum value. For each variation of $B_0$, the relative variations of the intensities of the signals received are calculated pixel by pixel. For each of these pixels, a series of relative relaxation time variations may therefore be gathered as a function of the value of $B_0$ about which they are measured. The theory of resonance further shows that these variations must be situated in the vicinity of an experimental curve 34 (FIG. 3) representative of the tissue of the pixel studied. For each pixel, curve 34 is then determined by statistical estimation. Preferably, this curve 34 corresponds to a statistical estimation in which the quadratic difference between the curve and the relative variations is minimum. This statistic estimation of curve 34 is called the method of least squares. With this curve calculated, the variant of the invention overcomes the measurement noises by replacing, for each pixel and each value of $B_0$, the relative calculated variation by the estimated corresponding value. This method improves the signal to noise ratio in the image of the relative variations. To obtain this result, means 35 for storing and statistically processing these images may be disposed in cascade with the means 12 for calculating the image of another type. The storage requires a sufficient memory capacity, its statistical treatment may be of any known type. Means 35 may also be included in the conventional image acquisition computer computer 11 which controls the implementation of this new method is preprogrammed for successively accomplishing all the acquisitions, all the image compositions and possibly all the statistical processing required;

For implementing the above described method it is necessary for the body, in the medical field that of a patient, to remain motionless during the different acquisitions. This means that these acquisitions are carried out at time intervals not exceeding a few minutes. This is particularly possible with the above described solution, particularly with the Bitter magnet.

What is claimed is:

1. A method of forming images by nuclear magnetic resonance comprising the steps of:
   acquiring an image of the volume element of a section of a body to be examined by discrimination of the relaxation times of the nucleii of said volume elements in the presence of a first value of a given orientating magnetic field;
   reiterating said acquisition step for a second value of said magnetic field; and
   forming another type of image of said section by representing for each image element the relative variations of the relaxation times between said step of acquiring and said reiterated step of acquiring.

2. The method as claimed in claim 1, wherein said acquisitions are reiterated a certain number of times, each time for different values of the fields and the image of the section is formed by representing the relative variations of the relaxation times by effecting a statistical estimation of the relative variations.

3. The method as claimed in claim 2, wherein the statistical estimation is established with minimum quadratic deviation.

4. A device for forming images by nuclear magnetic resonance of the type comprising
   means for subjecting a body to be examined to an orientating magnetic field,
   field gradient means for determining a section of the body,
   means for producing a pulsed alternating magnetic field for exciting the nucleii of the volume elements of the section,
   means for measuring the relaxation times of these nuclei after excitation,
   and means for acquiring an image of the section by representing these relaxation times, which device further comprises
   means for storing the image,
   means for varying the orientating magnetic field and the frequency of the pulsed magnetic field so as to acquire, using the same procedure, another image of the same section,
   and means for forming an image of this section, of another type, by representing the relative variations of the relaxation times between the first and second acquisitions.

5. The device as claimed in claim 4, further comprising means for reiterating the acquisitions a certain number of times, each time for different values of the field, and further comprising means for effecting a statistical estimation of the relative variations of the relaxation times to be represented.

6. The device as claimed in claim 4, or claim 5, wherein the means for subjecting a body to an orientating magnetic field comprises so called Bitter coils through which a pilot controlled electric current flows.

* * * * *